United States Patent [19]
Ueda et al.

[11] Patent Number: 5,372,239
[45] Date of Patent: Dec. 13, 1994

[54] APPARATUS FOR CONVEYING PLATE-FORM ARTICLES

[75] Inventors: Hisashi Ueda; Nobuyuki Aoyagi; Tadayuki Ueda, all of Tokyo, Japan

[73] Assignee: Kabushiki Kaisha Shinkawa, Tokyo, Japan

[21] Appl. No.: 64,453

[22] Filed: May 19, 1993

[30] Foreign Application Priority Data

May 19, 1992 [JP] Japan ................................. 4-150104

[51] Int. Cl.$^5$ ............................................. B65G 47/26
[52] U.S. Cl. ................................... 198/457; 198/468.6; 198/614
[58] Field of Search ................... 198/468.6, 774.1, 614, 198/457, 750, 597

[56] References Cited

U.S. PATENT DOCUMENTS 5,238,100  8/1993  Rose, Jr. et al. ................. 198/468.6

FOREIGN PATENT DOCUMENTS 0132223  10/1981  Japan ................................. 198/468.6
8704412   7/1987  WIPO ................................. 198/457

*Primary Examiner*—Cheryl L. Gastineau
*Attorney, Agent, or Firm*—Koda and Androlia

[57] ABSTRACT

A conveyor apparatus for a plate form article such as a lead frame including a main conveyor line and a working conveyor line for conveying the lead frame in a direction parallel to the length wise direction of the lead frame, and a sub-conveyor which transfers the lead frame to and from the main and working conveyor lines in a direction perpendicular to the conveyor lines, and the sub-conveyor being made of work-holders for holding the lead frame in such a manner that two ends of the length-wise direction of the lead frame are positioned perpendicular to the conveying direction of the sub-conveyor, a vertical driving cylinder for raising and lowering the work-holders, and a conveying mechanism, which includes a motor 61, timing belts, etc., for moving the work-holders in a direction perpendicular to the conveyor lines. Thus, a smooth conveyance of the lead frame by the sub conveyor is insured even though the lead frame has projected portions that are called "islands."

4 Claims, 11 Drawing Sheets

APPARATUS FOR CONVEYING PLATE-FORM ARTICLES

BACKGROUND OF THE INVENTION

1. Field of the Invention

The present invention relates to a conveyor apparatus for plate-form articles such as lead frames, etc.

2. Prior Art

Japanese Patent Application Laid-Open (Kokai) No. 62-235742 discloses one of the conventional apparatuses for conveying plate-form articles such as frames, etc.

The apparatus disclosed in this publication includes: a common main conveyor line which is installed in front of a multiple number of identical working devices; a working conveyor line installed on both sides of the working devices; and a sub-conveyor means that consists of a belt conveyor which is installed at right angles relative to and between the main conveyor and working conveyor lines.

In this apparatus, a lead frame conveyed by the main conveyor line is received by the sub-conveyor means installed on a supply side and then conveyed in a direction perpendicular to the main conveyor line. Thus, the lead frame is transferred to the working conveyor line on the supply side. Then, the lead frame is sent to the working devices by the working conveyor line and worked by the working devices. When the working is completed on the lead frame, the lead frame is conveyed to the working conveyor line on a discharge side and then received by the sub-conveyor means on the discharge side. The lead frame is thereafter transferred back to the main conveyor line by the sub-conveyor means.

Since the sub-conveyor means in the apparatus described above consists of a belt conveyor, it involves problems as described below:

Some lead frames have "islands" which are depressed areas in which pellets are installed. The "islands" are at the central area of the lead frame and formed at equal intervals in its length-wise direction.

When conveyed by the main and working conveyor lines, the lead frame is supported at both ends in the length-wise direction; thus, no problems would occur in the conveyance. However, on the sub-conveyor means, the lead frame is positioned so that its longer sides are positioned at right angles relative to the conveying direction of the sub-conveyor means. As a result, the island tends to be caught by belts, which are provided in a plurality number so as to meet the lead frames of different lengths. As a result, a smooth conveyance is occasionally impeded.

Furthermore, the island is supported at both ends by narrow linear portions of the lead frame; accordingly, an external load is applied on the island by the weight of the lead frame when the island is directly on the belts. This would result in a wire deformation if a wire-bonding has been completed on a lead frame.

SUMMARY OF THE INVENTION

The object of the present invention is to provide a conveyor apparatus for plate-form articles such as a lead frame which allows smooth conveyance of the plate-form articles without any deleterious effect on the plate-form articles, regardless of the presence or absence of islands.

The invention provides an improvement in a conveyor apparatus which substantially comprises a conveyor line which conveys plate-form articles (merely called "lead frame" in the description below) in the direction of their length-wise direction and a sub-conveyor means which conveys the lead frame in a direction perpendicular to the conveyor line, and the improvement is that the sub-conveyor means includes: work-holders which hold both sides of the lead frame which are in a perpendicular direction relative to the conveying direction of the sub-conveyor means; a vertical driving mechanism which raises and lowers the work-holders; and a conveyor (or horizontal driving) mechanism which moves the work-holders in a direction perpendicular to the conveyor line.

The work-holders of the sub-conveyor means are raised and lowered by the vertical driving mechanism so that the lead frame is received from the conveyor line or transferred back to the conveyor line. The work-holders are moved by the conveyor (or horizontal driving) mechanism towards and away from the conveyor line in a direction perpendicular to the conveyor line so that the lead frame is conveyed to and from the conveyor line. When conveyed, the lead frame is held by the work-holders at the sides which are in the direction perpendicular to the conveying direction of the sub-conveyor means. In other words, the lead frame is held by the work-holders by the leading edge and the rear edge thereof relative to the conveying direction. Accordingly, if the lead frame has no island, there is naturally no problem; and even in a case that the lead frame has island(s), the island(s) of the lead-frame is not caught by the sub-conveyor means, and the conveyance of the lead frame is executed without any external force applied to the island.

BRIEF DESCRIPTION OF THE DRAWINGS

FIG. 10 illustrates the operation of the conveyor apparatus, in which

FIG. 11 illustrates the operation of "return to the starting point" in which FIG. 12 illustrates the operation of "check of the starting point" in which

DETAILED DESCRIPTION OF THE INVENTION

One embodiment of the present invention will be described below with reference to the accompanying drawings. The conveyor apparatus of the present invention comprises basically two structures which work in cooperative: a lead frame conveying structure and a width changing structure for changing a width of lead frame holders (work-holders). The structure for conveying the lead frame will be described first.

Figure 1:
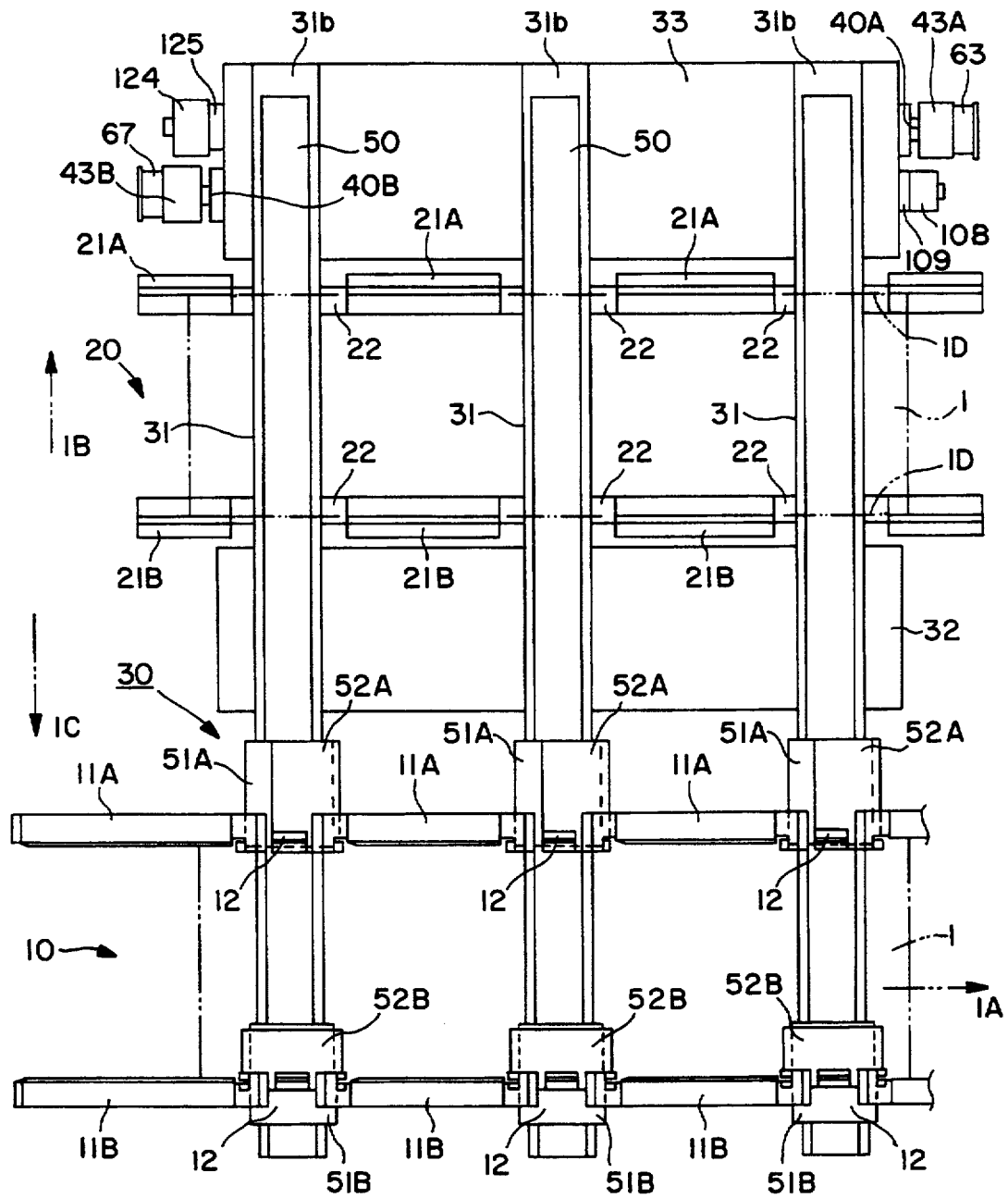
FIG. 1 is a top view of one embodiment of the conveyor apparatus for plate-form articles according to the present invention.
Figure 2:
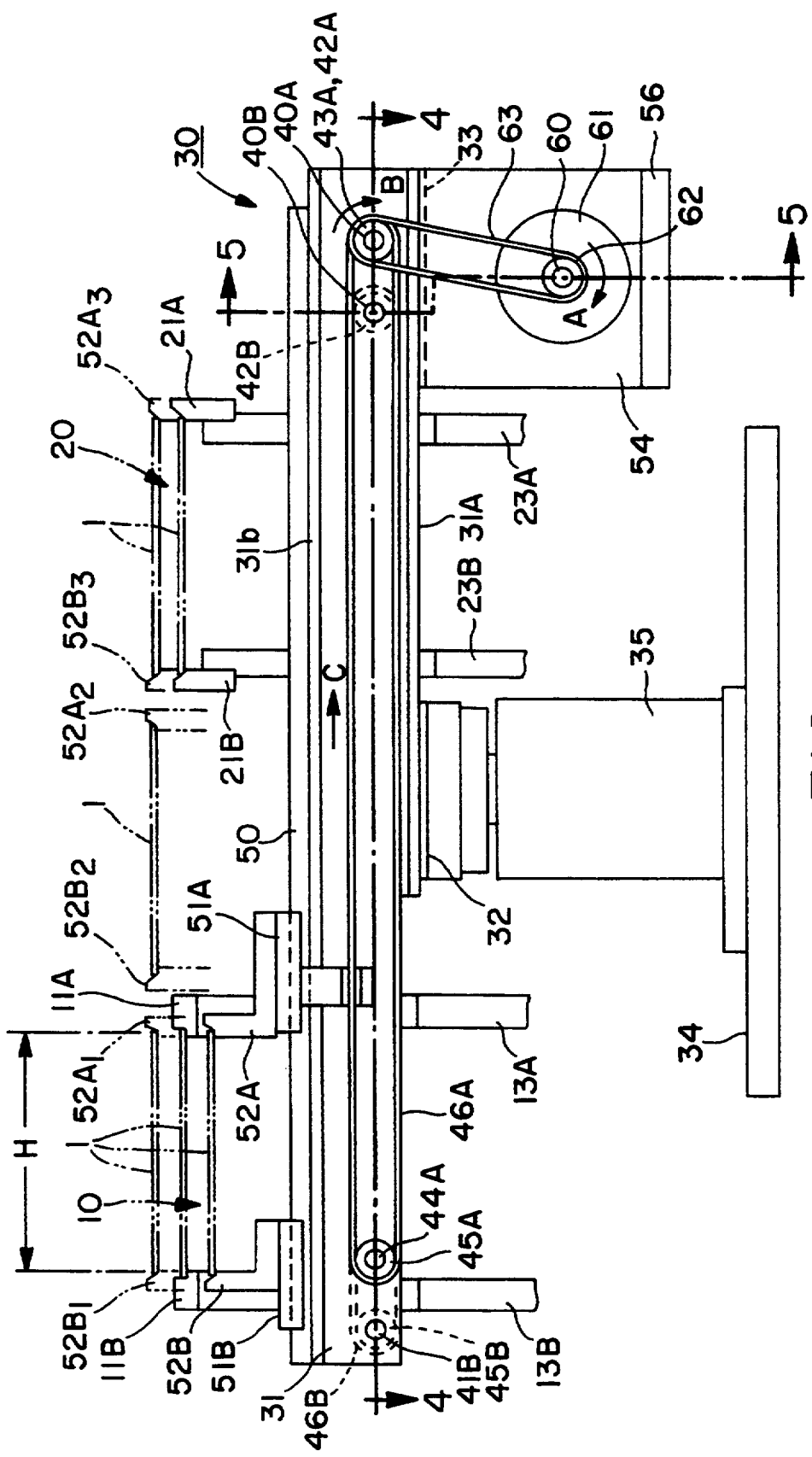
FIG. 2 is a right side view thereof.

As shown in FIGS. 1 and 2, the conveyor apparatus of the embodiment of the present invention includes: (a) a plurality of pairs of guide rails 11A and 11B installed in a main conveyor line 10 which conveys lead frames; (b) a plurality of pairs of guide rails 21A and 21B installed in a working conveyor line 20 which conveys lead frames to a working device (not shown) and conveys the lead frames, upon which working has been completed by the working device, from the working device; and (c) a sub-conveyor means 30 that conveys the lead frames from (the guide rails 11A and 11B of) the main conveyor line 10 onto (the guide rails 21A and 21B of) the working conveyor line 20. The sub-conveyor means 30 conveys the lead frames from the working conveyor line 20 to the main conveyor line 10 also.

Figure 3:
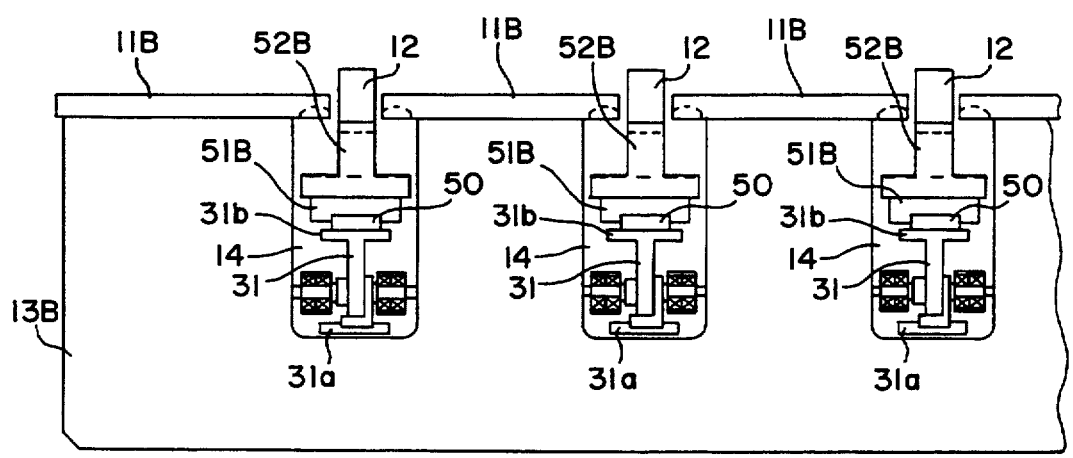
FIG. 3 is a front view thereof.

As seen from FIGS. 1 through 3, each pair of guide rails 11A and 11B of the main conveyor line 10 are installed so as to face each other and installed with fixed gaps 12 relative to the next pairs of rails at regular intervals. These guide rails 11A and 11B are provided on rail supporting plates 13A and 13B. Spaces 14 are formed in the rail supporting plates 13A and 13B in areas that correspond to the gaps 12.

Like the guide rails 11A and 11B, each pair of guide rails 21A and 21B of the work conveyor line 20 are installed so as to face each other with fixed gaps 22 relative to the next pairs of guide rails 21A and 21B at regular intervals. These guide rails 21A and 21B are disposed on rail supporting plates 23A and 23B. Spaces 24 (see FIG. 4) are formed between the rail supporting plates 23A and 23B in areas corresponding to the gaps 22.

As shown in FIGS. 1 through 4 (primarily in FIG. 2), the sub-conveyor means 30 includes conveyor supports 31 installed in the spaces 14 and 24. Each of the conveyor supports 31 runs through the spaces 14 and 24. The bottom plates 31a of the conveyor supports 31 (three in this embodiment) are connected by connecting plates 32 and 33 so that the conveyor supports 31 are connected into a single unit. The connecting plate 32 is connected to the operation part of a vertical driving cylinder (or vertical driving mechanism) 35 which is secured to a base 34.

Figure 4:
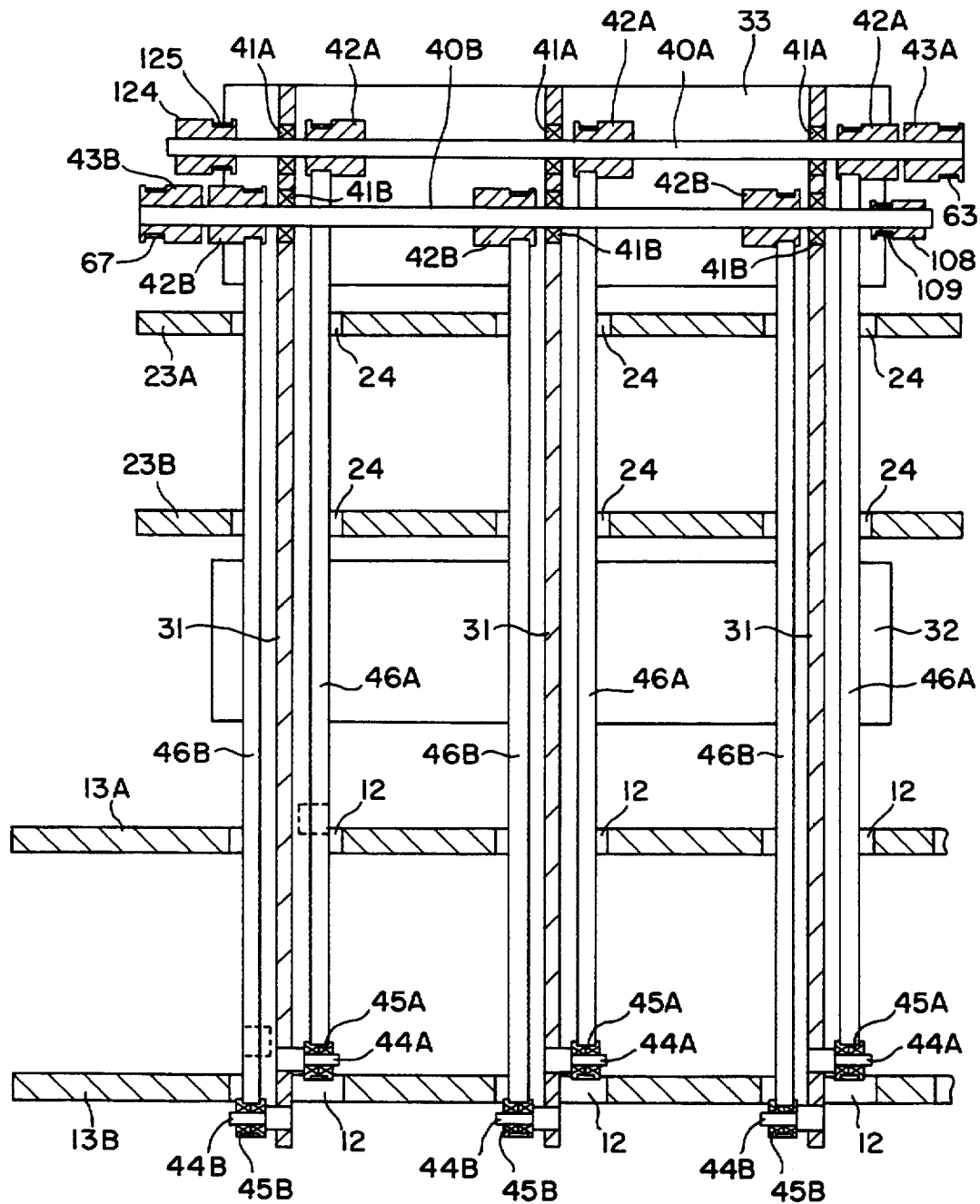
FIG. 4 is a cross section taken along the line 4—4 in FIG. 2.

As shown in FIGS. 2 and 4, two drive shafts 40A and 40B which are parallel to each other are supported on the conveyor supports 31 via bearings 41A and 41B. The drive shafts 40A and 40B are rotatable and located in an area outside the working conveyor line 20. Conveyor timing pulleys 42A are mounted on the drive shaft 40A. These timing pulleys 42A are located on the right side (in FIG. 1) of each conveyor support 31. Also, conveyor timing pulleys 42B are mounted on the drive shaft 40B. These timing pulleys 42B are on the left side of each conveyor support 31.

Furthermore, a drive timing pulley 43A is mounted on the right end of the drive shaft 40A, and a drive timing pulley 43B is mounted on the left end of the drive shaft 40B.

Supporting shafts 44A and 44B are mounted on each conveyor support 31 so as to positionally correspond to the conveyor timing pulleys 42A and 42B. These shafts 44A and 44B are provided on each conveyor support 31 so that they are on the rail supporting plate 13B side. Rollers 45A and 45B are respectively provided on the supporting shafts 44A and 44B in a rotatable manner. A timing belt 46A is installed between each conveyor timing pulley 42A and roller 45A, and a timing belt 46B is installed between each pulley 42B and roller 45B.

As shown in FIGS. 1 through 3 and FIG. 5, a linear guide 50 is provided on the top plate 31b of each conveyor support 31, and two conveyor stands 51A and 51B are installed on each linear guide 50 in a slidable manner. A pair of work-holders 52A and 52B which hold the lead frame 1 thereon are provided on each of the conveyor stands 51A and 51B.

Each conveyor stand 51A is connected to the corresponding timing belt 46A so that the respective work-holders 52A are in the same position. Similarly, each conveyor stand 51B is connected to the corresponding timing belt 46B so that the respective work-holders 52B are in the same position.

Figure 5:
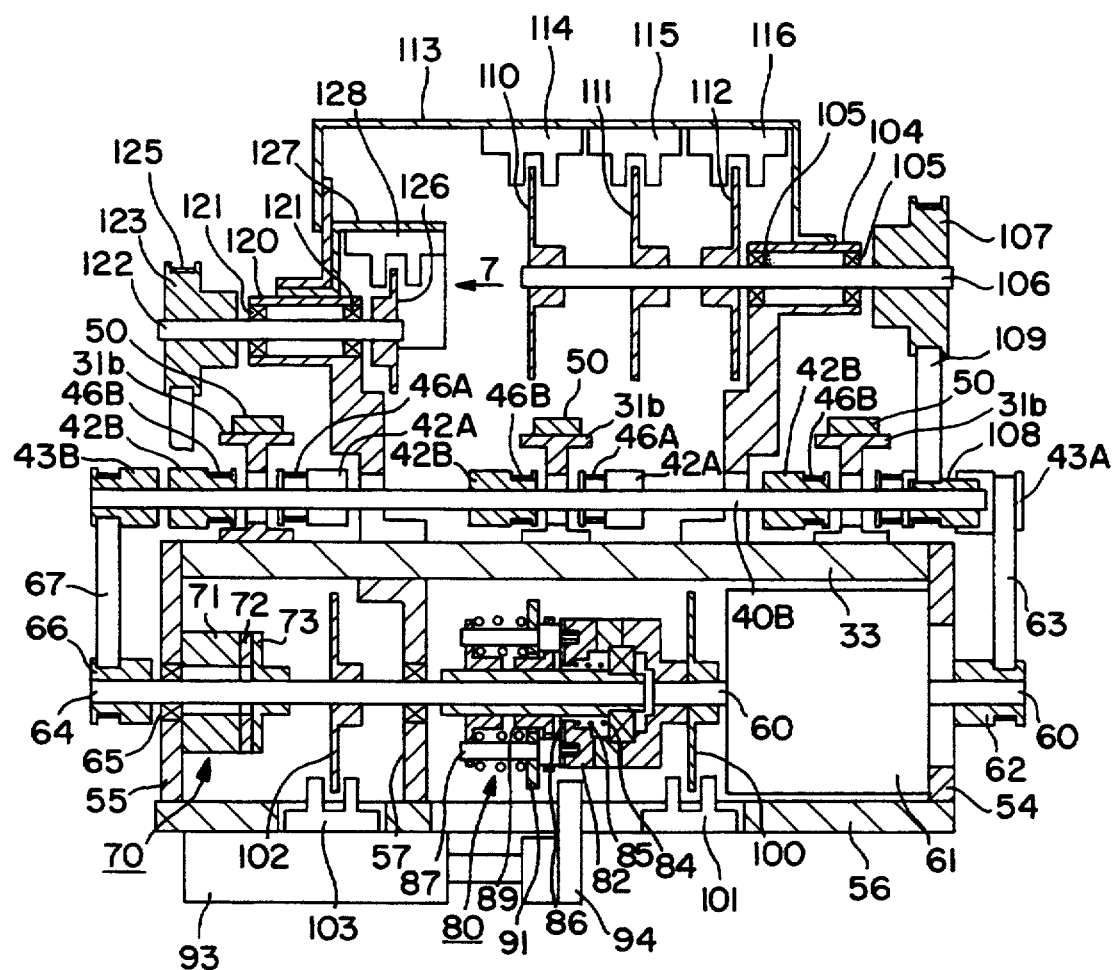
FIG. 5 is a cross section taken along the line 5—5 in FIG. 2.

As shown in FIG. 5, supporting plates 54 and 55 are respectively attached to the right and left ends of the connecting plate 33. A bottom plate 56 is fastened to the lower ends of the supporting plates 54 and 55, and a supporting plate 57 is fastened to the connecting plate 33 and bottom plate 56.

A motor 61, which has an output shaft 60 extending from both ends of the motor 61, is mounted to the supporting plate 54. A timing pulley 62 is attached to one end (right end in FIG. 5) of the output shaft 60 so as to positionally correspond to the drive timing pulley 43A. A timing belt 63 is provided between the drive timing pulley 43A and the timing pulley 62.

On the other side (left side in FIG. 5) of the output shaft 60, there is a rotary shaft 64. The rotary shaft 64 is supported on the supporting plates 55 and 57 via bearings 65 so as to be coaxial with the output shaft 60. A timing pulley 66 is attached to a first end (left end in FIG. 5) of the rotary shaft 64. The timing pulley 66 positionally corresponds to the drive timing pulley 43B, and a timing belt 67 is provided between the drive timing pulley 43B and the timing pulley 66.

An electromagnetic brake 70 is mounted on the rotary shaft 64 and supporting plate 55. More specifically, a brake drive 71 of the brake 70 is fastened to the supporting plate 55, and a brake plate 72 is fixed to this brake drive 71. The other brake plate 73 of the brake 70 is provided on the rotary shaft 64.

Figure 6:
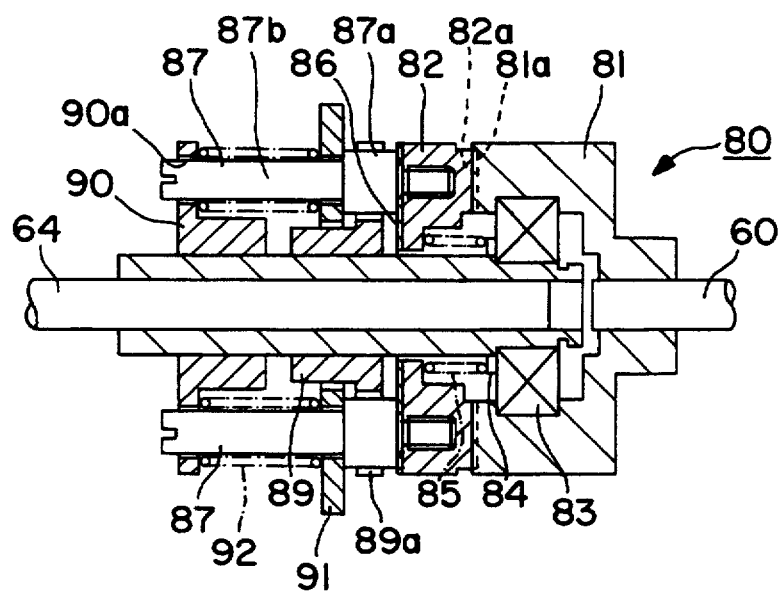
FIG. 6 is an enlarged cross section of the clutch member which is used in the embodiment and shown in FIG. 5.

A clutch device 80 is mounted on the second end (right end in FIG. 5) of the rotary shaft 64 and on the end (left end in FIG. 5) of the output shaft 60 of the motor 61. As shown in FIGS. 5 and 6, the clutch device 80 comprises first and second members 81 and 82 that are provided, respectively, with clutch areas 81a and 82a that engage with and disengage from each other.

The first clutch member 81 is mounted on the output shaft 60. The rotary shaft 64 is supported by the first clutch member 81 via a bearing 83. Springs 85 are installed between the clutch member 82 and a striking plate 84 which is disposed on the bearing 83 side; thus clutch areas 81a and 82a of the two clutch members 81 and 82 are urged in the opposite directions by the springs 85.

Two rods 87 are mounted on the second clutch member 82 via a plate spring 86. Each of the two rods 87 consists of a large-diameter portion 87a and a small-diameter portion 87b. The respective large-diameter portions 87a are guided, in a freely-slidable manner, in U-shaped guide grooves 89a that are formed in a guide member 89 mounted to the rotary shaft 64. The rear ends (left ends in FIG. 6) of the small-diameter portions 87b are guided in a freely-slidable manner in guide holes 90a that are formed in a guide member 90 mounted to the rotary shaft 64. A movable plate 91 is installed on the small-diameter portions 87b of the rods 87 in a slidable manner, and springs 92 are installed on the rods 87. The springs 92 are provided between the movable plate 91 and the guide member 90. The movable plate 91 is thus urged by the springs 92 to contact the large-diameter portions 87a of the rods 87.

A cylinder 93 for engaging-and-disengaging the clutch device 80 is mounted on the bottom plate 56, and an operating plate 94 is attached to the operating rod of the clutch cylinder 93. The operating plate 94 is disposed in front of the movable plate 91 (i.e., on the right-hand side of the movable plate 91 in FIG. 5).

Next, the structure for a width adjustment changing the distance between pairs of work-holders will be described.

As shown in FIG. 5, a starting-point cam 100 used for width adjustment is attached to the output shaft 60 of the motor 61. In addition, a starting-point sensor 101 used for width adjustment is fastened to the bottom plate 56 so as to positionally correspond to the width-adjustment-starting-point cam 100.

A starting-point cam 102 used for conveying is attached to the rotary shaft 64, and a starting-point sensor 103 used for conveying is fastened to the bottom plate 56 so as to positionally correspond to the convey-starting-point cam 102.

A bearing holder 104 is provided on the upper surface of the connecting plate 33 on the right-hand side, and a rotary shaft 106 is supported in this bearing holder 104 via bearings 105. A timing pulley 107 is attached to the rotary shaft 106. A timing pulley 108 is attached to the drive shaft 40B so as to positionally correspond to the timing pulley 107. A timing belt 109 is provided between the timing pulley 107 and a timing pulley 108.

Furthermore, three cams, that includes a limit cam 110 used for conveying, a plus side cam 111 used for conveying in the plus direction (allow C direction) and a minus side cam 112 used for conveying in the minus direction (opposite to allow C direction), are mounted on the rotary shaft 106. A limit sensor 114 used for conveying, a plus side sensor 115 used for conveying in the plus direction and a minus side sensor 116 used for conveying in the minus direction are fastened to a holder plate 113, which is secured to the bearing holder 104, so as to positionally correspond, respectively, to the convey-limit cam 110, the plus side convey-cam 111 and the minus side convey-cam 112.

A bearing holder 120 is provided on the upper surface of the connecting plate 33 on the left-hand side, and a rotary shaft 122 is supported in this bearing holder 120 via bearings 121. A timing pulley 123 is attached to the rotary shaft 122, and a timing pulley 124 is attached to the drive shaft 40A (shown in FIG. 4). The two pulleys 123 and 124 positionally correspond to each other, and a timing belt 125 is installed between the timing pulley 123 and the timing pulley 124.

Furthermore, a cam 126 used for width adjustment is attached to the rotary shaft 122.

Figure 7:
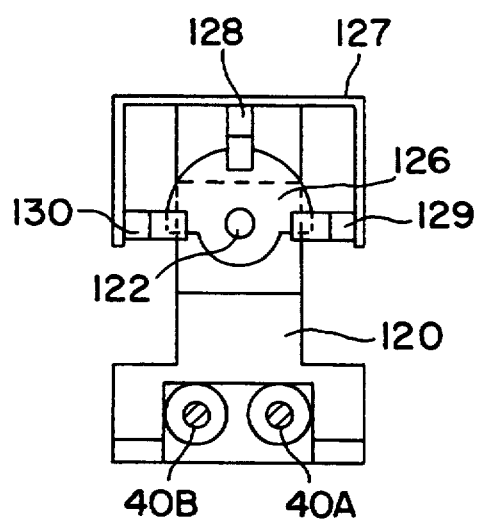
FIG. 7 is a view taken in the direction of arrow 7 in FIG. 5.

As shown in FIGS. 5 and 7, three sensors, that is, a limit sensor 128 used for width adjustment, a plus side sensor 129 used for width adjustment in the plus direction (width increase direction) and a minus side sensor 130 used for width adjustment in the minus direction (width decrease direction), are attached to a holding plate 127 which is attached to the bearing holder 120 so that these three elements are separated by 90 degrees.

Figure 8:
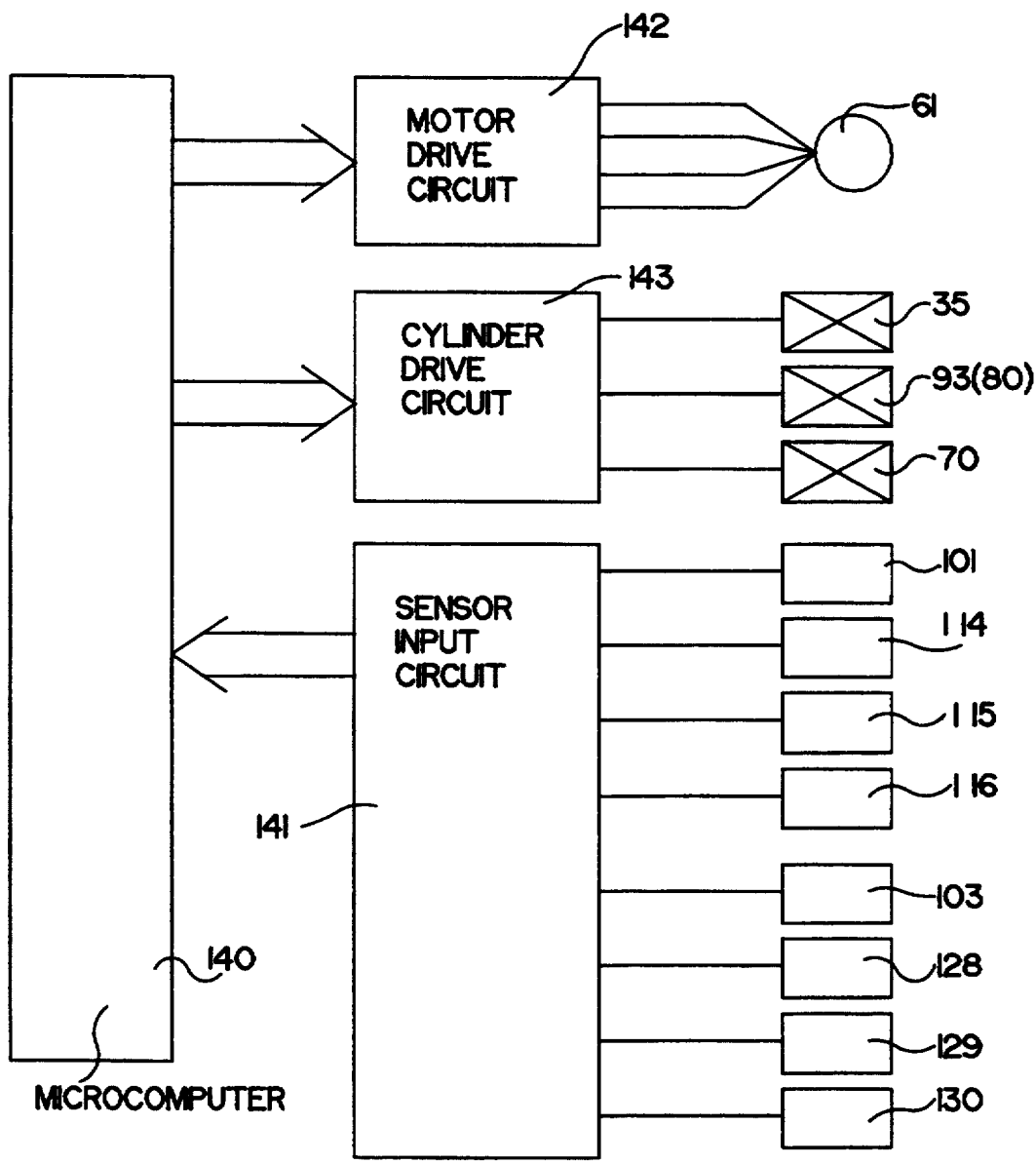
FIG. 8 is a block diagram of the control circuit used in the embodiment.
Figure 9:
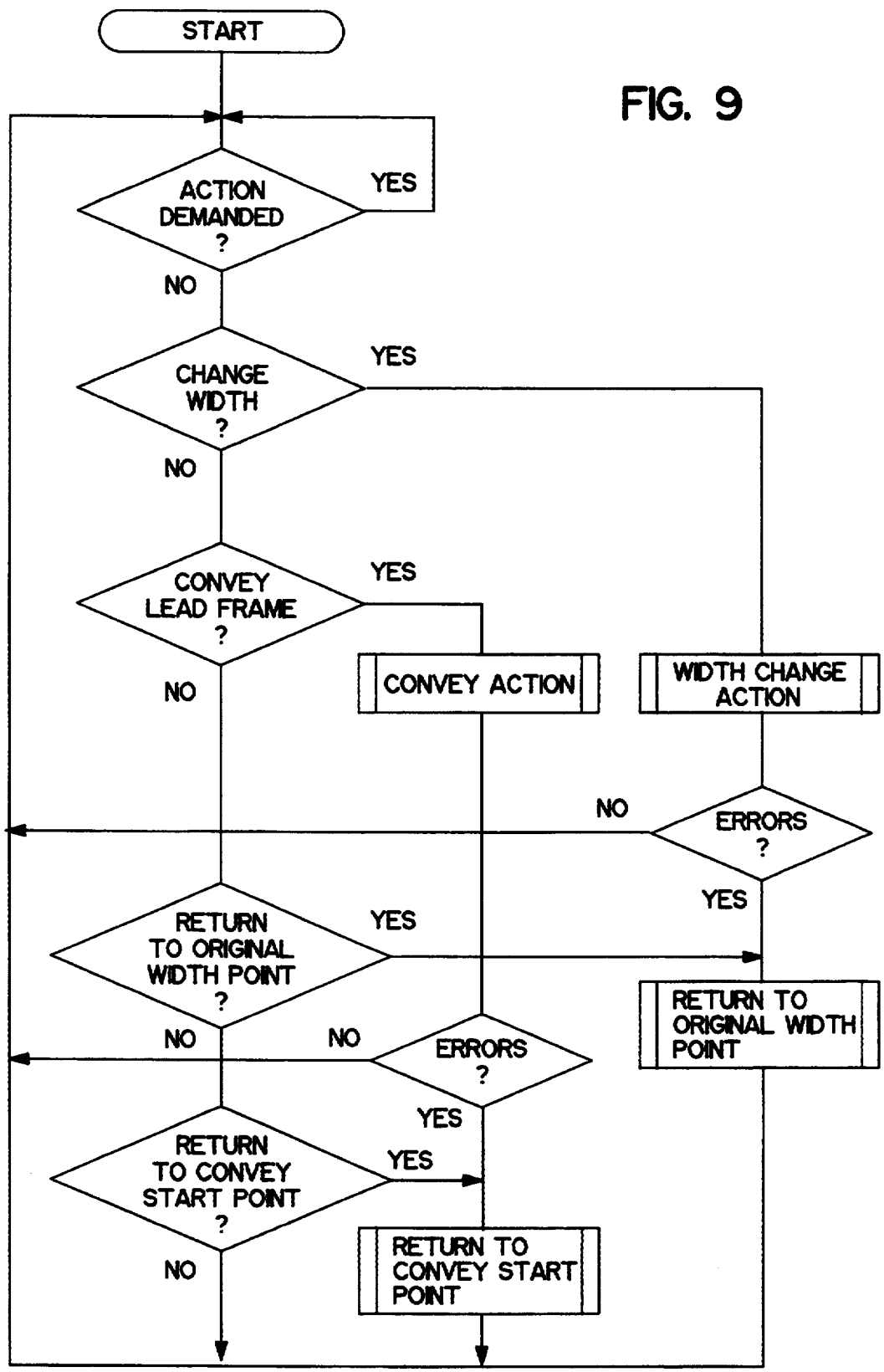
FIG. 9 is a flow chart for controlling the conveyance of the lead frames and the width adjustment of the work-holders.
Figure 10A:
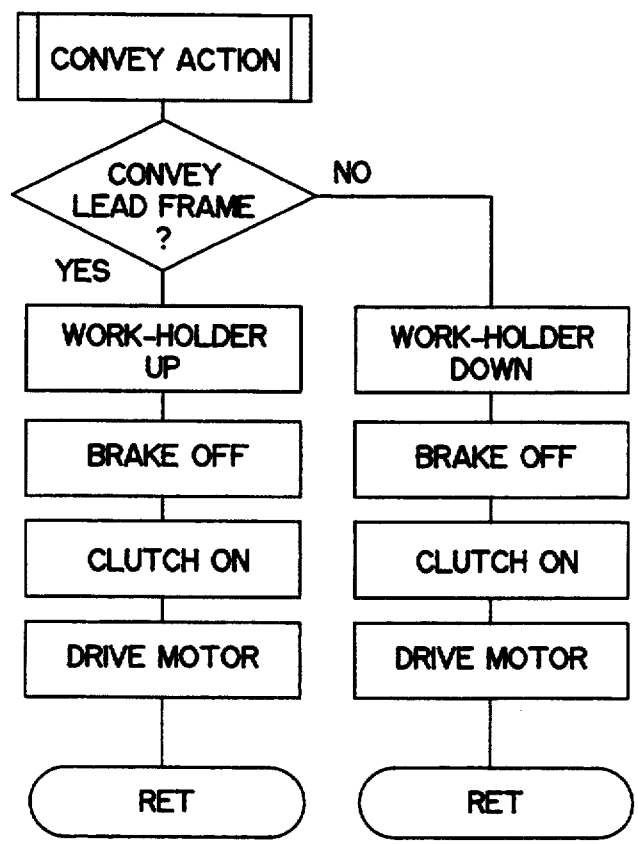
FIG. 10(a) is a flow chart of the lead frame conveying operation.
Figure 10B:
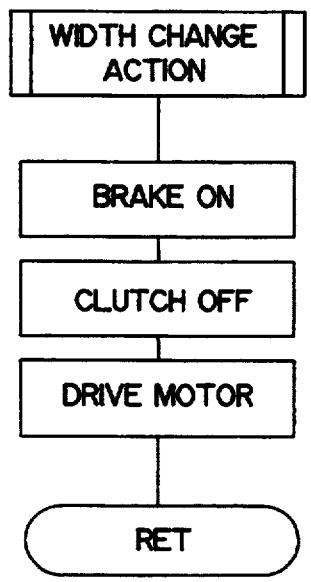
FIG. 10(b) is a flow chart of the width adjustment operation.
Figure 11A:
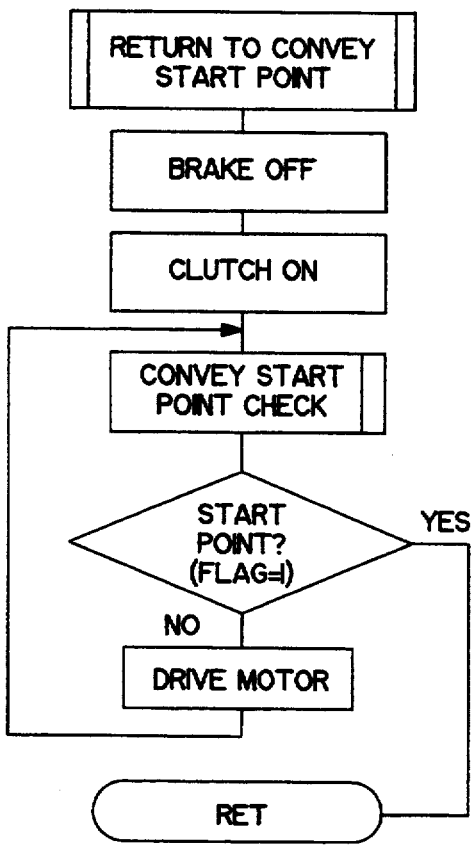
FIG. 11(a) is a flow chart showing the return to the convey starting point.
Figure 11B:
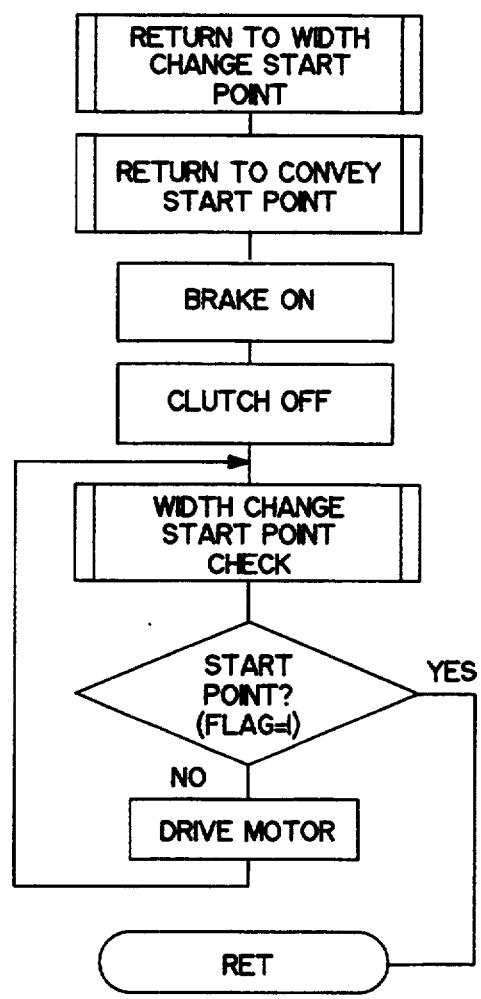
FIG. 11(b) is a flow chart showing the return to the width adjustment starting point.
Figure 12A:
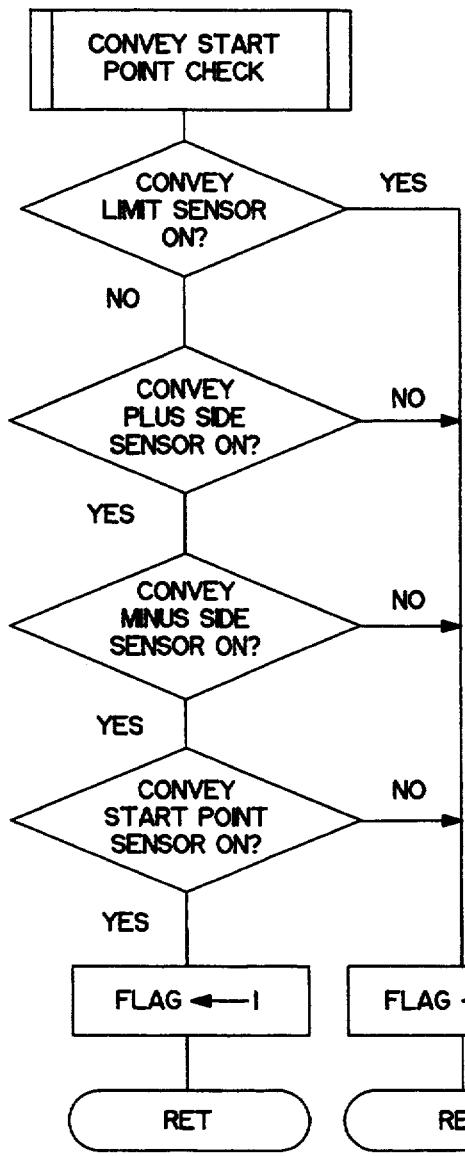
FIG. 12(a) is a flow chart showing the checking process of the convey starting point.
Figure 12B:
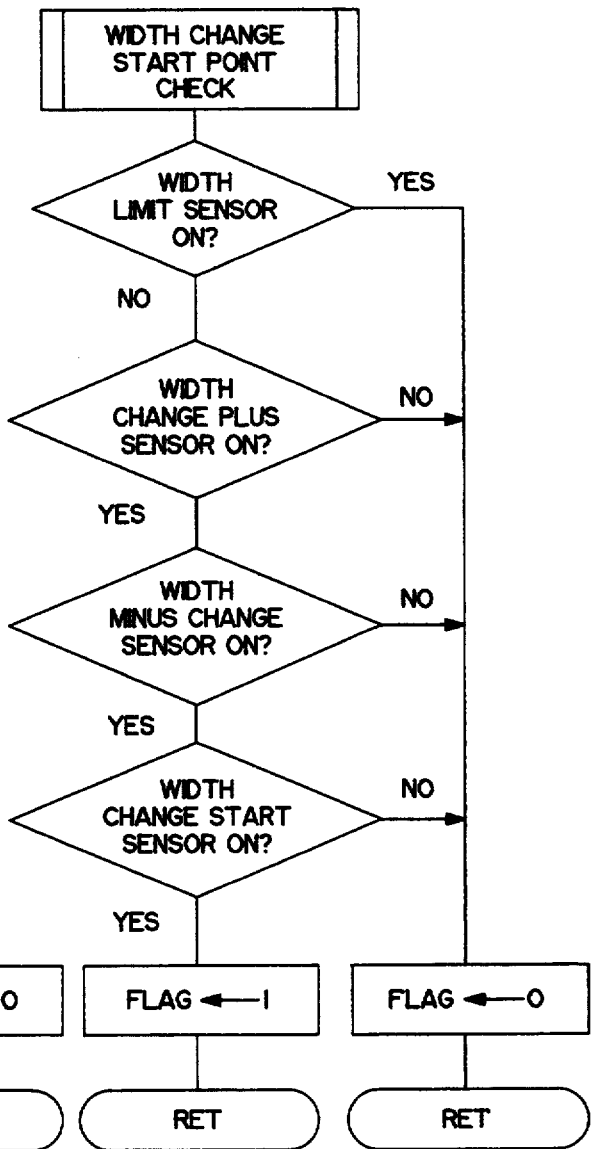
FIG. 12(b) is a flow chart showing the checking process of the width adjustment starting point.

FIG. 8 shows a control circuit for operating the conveyor apparatus of the present invention.

Signals from the sensors 101, 103, 114, 115, 116, 128, 129 and 130 are inputted into a microcomputer 140 via a sensor input circuit 141. In accordance with the signals from the sensors 101, 103, 114, 115, 116, 128, 129 and 130, the microcomputer 140 actuates the motor 61 (shown in FIG. 5) via a motor drive circuit 142. The microcomputer 140 also controls, via a cylinder driving circuit 143, the on-off of the vertical driving cylinder 35 (shown in FIG. 2), the on-off of the clutch engaging-and-disengaging cylinder 93 (shown in FIG. 5), and the on-off of the electromagnetic brake 70.

The operation of the above embodiment will be described below:

(1-A) First, an explanation will be given on how the sub-conveyor means 30 transfers a lead frame form the main conveyor line 10 on the working conveyor line 20.

The distance H between the work-holder 52A and the work-holder 52B is set so that a lead frame is supported by them, and the work-holders 52A and 52B are positioned near the guide rails 11A and 11B of the main conveyor line 10. Lead frame guiding surfaces of the work-holders 52A and 52B are positioned below the guiding surfaces of the guide rails 11A and 11B. The positions of the thus positioned work-holders 52A and 52B are called the "convey starting point." The conveying of the lead frame is performed in accordance with the flow charts shown in FIG. 9, FIG. 10(a), FIG. 11(a) and FIG. 12(a).

More specifically, when a lead frame 1 is conveyed along the guide rails 11A and 11B of the main conveyor line 10 by a conveyor means (not shown), the lead frame 1 is conveyed in a length-wise direction of the lead frame as shown in arrow 1A; and when the lead frame 1 is stopped above the work-holders 52A and 52B of the sub-conveyor means 30, the vertical driving cylinder 35 is switched on via the cylinder driving circuit 143. This is done in response to a command from the microcomputer 140.

As a result, the operating rod of the vertical driving cylinder 35 is extended, and the work-holders 52A and 52B, together with the conveyor supporting 31, are raised to positions 52A$_1$ and 52B$_1$ as seen in FIG. 2. As a result, the lead frame 1 on the guide rails 11A and 11B of the main conveyor line 10 is transferred onto and supported by the work-holders 52A and 52B of the sub-conveyor means 30.

Next, in response to the commands from the microcomputer 140 via the cylinder driving circuit 143, the electromagnetic brake 70 is switched off, and the clutch 80 is brought into a state in which the clutch areas 81a and 82a of the clutch members 81 and 82 are engaged with each other (clutch 80 is "on"). This engagement is obtained when the clutch engaging-anddisengaging cylinder 93 is switched off, and the operating plate 94 is separated from the movable plate 91.

Under this state, the motor 61 is actuated in the plus direction that rotates the output shaft 60 in the direction of arrow A (see FIG. 2). This results in that the drive shaft 40A is rotated in the direction of arrow B via the timing pulley 62, the timing belt 63 and the drive timing pulley 43A so that the work-holders 52A are moved via the first conveyor system.

When the output shaft 60 is thus rotated in the direction of arrow A, the rotary shaft 64 is rotated via the clutch 80 (or via the clutch members 81 and 82, the rods 87 and the guide members 89 and 90). The rotation of the rotary shaft 64 is transmitted to the drive shaft 40B via the timing pulley 66, the timing belt 67 and the drive timing pulley 43B so that the work-holder 52B are moved via the second conveyor system. In other words, the drive shaft 40B is thus rotated in the same direction as the drive shaft 40A (in the arrow B direction).

As a result of the rotations of the drive shafts 40A and 40B in the same direction, the timing belts 46A and 46B are moved in the direction of arrow C via the conveyor timing pulleys 42A and 42B, so that the work-holders 52A and 52B are at positions $52A_2$ and $52B_2$, which is a wait position of the work-holders 52A and 52B.

When there is no lead frame on the guide rails 21A and 21B of the working conveyor line 20, the motor 61 is again (or further) driven so that the output shaft 60 is rotated in the direction of arrow A. As a result, the belts 46A and 46B are moved in the arrow C direction via the first and second belt conveyor systems so that the work-holders 52A and 52B are moved above the guide rails 21A and 21B of the working conveyor line 20 as indicated by $52A_3$ and $52B_3$.

Next, the vertical driving cylinder 35 is switched off, and the cylinder 35 is caused to operate in the opposite direction from the previous movement (i.e., the operating rod of the vertical driving cylinder 35 is retracted). As a result, the work-holders 52A and 52B are lowered, and the lead frame 1 on the work-holders 52A and 52B of the sub-conveyor means 30 is transferred onto the guide rails 21A and 21B of the working conveyor line 20.

Thereafter, the motor 61 is driven in the direction opposite from that described above, and the work-holders 52A and 52B return to the "convey starting point" position, which is beneath the guide rails 11A and 11B as indicated by the solid lines in FIG. 2.

The lead frame 1 transferred to the guide rails 21A and 21B as described above is sent along the working conveyor line 20 by a pusher means (not shown) to the working device.

As seen from the above and particularly from FIG. 2, the lead frame 1 is supported on the work-holders 52A and 52B at its both ends (right and left ends in FIG. 2), and these ends (referred to by 1D in FIG. 1) are in a perpendicular direction relative to the direction the sub-conveyor means 30 conveys the lead frame 1 from the main conveyor line 10 to the work conveyor line 20 as indicated by an arrow 1B in FIG. 1. As seen from FIG. 1, the both ends 1D of the lead frame 1 which are supported by the work-holders 52A and 52B are, in other words, the two sides which are in the length-wise direction of the lead frame 1.

(1-B) Next, an explanation will be given on how the sub-conveyor means 30 transfers a lead frame, upon which work has been completed by the working device (not shown), from the working conveyor line 20 to the main conveyor line 10.

In this case, the work-holders 52A and 52B wait at positions beneath the guide rails 21A and 21B of the working conveyor line 20. These positions are the "starting point of the (backward) convey operation." A lead frame 1, upon which work has been completed, is sent along the guide rails 21A and 21B from the working device, and when the lead frame 1 is stopped above the work-holders 52A and 52B of the sub-conveyor means 30, the vertical driving cylinder 35 is switched on so that the operating rod of the cylinder 35 is extended. As a result, the work-holders 52A and 52B are raised to the position indicated by $52A_3$ and $52A_3$, and the lead frame 1 on the guide rails 21A and 21B is transferred to and supported by the work-holders 52A and 52B.

Next, the output shaft 60 of the motor 61 is rotated in the (minus) direction which is opposite from the arrow A direction. As a result, the work-holders 52A and 52B are moved (to the left in FIG. 2) to positions $52A_2$ and $52B_2$ and wait at these positions.

Then, as a result of a signal that indicates that the lead frame 1 is ready to be forwarded to the main conveyor line 10, the output shaft 60 of the motor 61 is further rotated in the minus direction. Thus, the work-holders 52A and 52B are moved (to further left in FIG. 2) to positions $52A_1$ and $52B_1$ which are above the guide rails 11A and 11B of the main conveyor line 10.

Thereafter, the vertical driving cylinder 35 is switched off to retract the operating rod of the cylinder 35; thus, the work-holders 52A and 52B are lowered and positioned under the guide rails 11A and 11B of the main conveyor line 10. This results in that the lead frame 1 on the work-holders 52A and 52B of the sub-conveyor means 30 is transferred onto the guide rails 11A and 11B of the main conveyor line 10.

Next, the motor 61 is driven in the plus direction so that the output shaft 60 is rotated in the direction of arrow A. The work-holders 52A and 52B are positioned beneath the guide rails 21A and 21B, so that the work-holders 52A and 52B wait to convey the next lead frame.

The lead frame 1 moved onto the guide rails 11A and 11B of the main conveyor line 10 is conveyed out by a conveyor means (not shown).

When the lead frame 1 upon which a work has been done is conveyed from the work conveyor line 20 to the main conveyor line 10, the lead frame 1 is supported on the work-holders 52A and 52B at its both ends (right and left ends in FIG. 2) which are in a perpendicular direction relative to the direction the sub-conveyor means 30 conveys the lead frame 1 from the working conveyor line 20 to the main conveyor line 10 as indicated by arrow 1C in FIG. 1. As seen from FIG. 1, the both ends 1D of the lead frame 1 which are supported by the work-holders 52A and 52B are, in other words, the two sides which are in the length-wise direction of the lead frame 1.

(2-A) Next, an explanation will be given as to how the distance H between the work-holder 52A and the work-holder 52B is changed in response to the change due to a different type of lead frame to be conveyed. The distance or width change is accomplished in accordance with the flow charts shown in FIG. 9, FIG. 10(b), FIG. 11(b) and FIG. 12(b).

First, the work-holders 52A and 52B are moved to their normal or original positions by a command from the microcomputer 140.

Next, the electromagnetic brake 70 is switched on and the clutch 80 is set off.

The switching off of the electromagnetic brake 70 brings the brake plate 73 to contact the brake plate 72, which results in that the rotary shaft 64 is locked so that it cannot rotate.

The setting off (or disconnecting) of the clutch 80 is accomplished by actuating the clutch engaging-and-disengaging cylinder 93 so that the operating rod of the cylinder 93 is retracted. In other words, when the operating rod is moved to the left in FIG. 5, the operating plate 94, overcoming the force of the springs 92, moves the movable plate 91 to the left. This brings the clutch member 82 to move to the left due to the driving force of the springs 85. As a result, the clutch area 82a of the clutch member 82 is separated from the clutch area 81a of the clutch member 81. The clutch 80 is thus brought into an off or disengaged position.

Accordingly, the rotation of the output shaft 60 of the motor 61 is not transmitted to the rotary shaft 64.

Under this situation, when the motor 61 is actuated and the output shaft 60 of the motor 61 is rotated in the plus direction or in the arrow A direction, the drive shaft 40A is rotated in the direction of arrow B via the timing pulley 62, the timing belt 63 and the drive timing pulley 43A. As a result, the timing belts 46A are moved in the direction of arrow C via the conveyor timing pulleys 42A, and the work-holders 52A are moved in the arrow C direction by the timing belts 46A.

Meanwhile, the rotary shaft 64 is not rotated even if the motor 61 is actuated since the clutch 80 is off as described above. Accordingly, the timing belts 64B which are linked to the work-holders 52B are not moved, and the work-holders 52B are not moved either. In other words, only the work-holders 52A are moved in a direction away from the work-holders 52B. Thus, the distance H between the work-holders 52A and 52B is widened.

(2-B) Conversely, if the output shaft 60 is rotated in the minus direction or in the direction opposite from the direction of arrow A, the work-holders 52A are moved toward the work-holders 52B, and the distance H between the work-holders 52A and the work-holders 52B is made narrower.

As seen from the above, the distance H can be set at any desired amount by controlling the direction and amount of rotation of the output shaft 60 of the motor 61. Thus, the distance H can be changed to meet any width of the different size lead frames.

The amount of rotation of the output shaft 60 can easily be controlled by digital setting.

In the embodiment described above, the conveyor stands 51A and 51B, to which the work-holders 52A and 52B are mounted, are connected to separate timing belts 46A and 46B in order to change the distance between the work-holders 52A and 52B to meet the changes in the lead frames of different widths. However, it would be possible to use the timing belt 46A only with the conveyor stands 51A and 51B connected thereto. It goes without saying, in this case, that the rotary shaft 64, the electromagnetic brake 70 and the clutch 80 are not necessary.

Furthermore, it would also be possible to combine the conveyor stands 51A and 51B into a single unit, so that it is moved by a cylinder, etc.

According to the present invention, in the conveying apparatus which includes (a) a conveyor line that conveys plate-form articles in the length-wise direction thereof and (b) a sub-conveyor means which conveys the plate-form articles in a perpendicular direction from the conveyor line: the sub-conveyor means has (1) work-holders which hold opposite ends (or edges) of a lead frame, said edges being in a direction perpendicular to the direction of the sub-conveyor means conveys the plate-form article, (2) a vertical driving mechanism which raises and lowers the work-holders, and (3) a conveyor mechanism which moves the work-holders in a direction perpendicular to the conveyor lines.

Accordingly, when a lead frame is conveyed (in a perpendicular direction) from the conveyor line or from the working conveyor line, both sides (or edges) of the lead frame in the direction perpendicular to the conveying direction of the sub-conveyor means are held by the work-holders. Accordingly, a smooth conveying action of lead frames, regardless of the "island" of each lead frame, is insured.

We claim:

1. A conveyor apparatus for conveying lead frames with islands in a semiconductor processing apparatus, said conveyor apparatus comprising a main conveyor line and a working conveyor line parallel to said main conveyor line, both of said main and working conveyor lines convey a lead frame in a length-wise direction of said lead frame and a sub-conveyor means which conveys said lead frame in a perpendicular direction from said main and working conveyor lines, said sub-conveyor means comprising:

work-holders which support both opposing sides of said lead frame which are in a perpendicular direction relative to a conveying direction of said sub-conveyor means, said work-holders being movable in said perpendicular direction to positions corresponding to said main and working conveyor lines;

a vertical driving means which raises and lowers said work-holders when said work-holders are at said positions corresponding to said main and working conveyor lines;

a conveyor mechanism which moves said work-holders in said direction perpendicular to said main and working conveyor lines;

a means for changing a spacing between said work-holders to correspond to a width of said lead frames when said means for changing is driven; and a single drive means for selectively driving said conveyor mechanism and said means for changing.

2. A conveyor apparatus according to claim 1, wherein said main conveyor line comprises a plurality of pairs of guide rails wherein each of said pair of side rails of the main conveyor line are installed to face its other and fixed gaps are provided at regular intervals between each pair of said plurality of pairs of side rails.

3. A conveyor apparatus according to claim 2, wherein said working conveyor line comprises a plurality of pairs of guide rails wherein each of said pair of guide rails of the main conveyor lane are installed to face its other and fixed gaps are provided at regular intervals between each pair of said plurality of pairs of side rails.

4. A conveyor apparatus according to claim 3, wherein said vertical driving mechanism raises and lowers said work-holders to positions above and below the guide rails of said main and working conveyor lines.

* * * * *